United States Patent [19]
Huang

[11] Patent Number: 5,200,880
[45] Date of Patent: Apr. 6, 1993

[54] METHOD FOR FORMING INTERCONNECT FOR INTEGRATED CIRCUITS

[75] Inventor: Kuei-Wu Huang, Irving, Tex.

[73] Assignee: SGS-Thomson Microelectronics, Inc., Carrollton, Tex.

[21] Appl. No.: 808,600

[22] Filed: Dec. 17, 1991

[51] Int. Cl.⁵ .................. H01G 4/06; H01L 21/285
[52] U.S. Cl. .................................... 361/311; 437/192
[58] Field of Search .......................... 361/311–313; 437/41, 192, 195; 357/51, 54

[56] References Cited

U.S. PATENT DOCUMENTS

| | | | |
|---|---|---|---|
| 4,920,072 | 4/1990 | Keller et al. | 437/192 |
| 5,005,067 | 4/1991 | Sakata et al. | 357/54 |
| 5,110,762 | 5/1992 | Nakahara et al. | 437/192 X |
| 5,112,765 | 5/1992 | Cederbaum et al. | 437/41 |

Primary Examiner—Donald A. Griffin
Attorney, Agent, or Firm—Kenneth C. Hill; Lisa K. Jorgenson; Richard K. Robinson

[57] ABSTRACT

According to the present invention, a thin conductive layer is formed over an underlying structure in an integrated circuit. The underlying structure can be either a semiconductor substrate or an interlevel interconnect signal line. An insulating layer is deposited over the device. The insulating layer is patterned and etched in order to expose a portion of the underlying conductive layer and to define an interconnect signal line. When the signal line locations are etched away, the thin conductive layer acts as an etch stop and protects the underlying structure. A metal refill process can be used to then form interconnects and contacts within the etched interconnect lines. This results in interconnect and contacts having upper surfaces which are substantially coplanar with the upper surface of the insulating layer in which they are formed.

39 Claims, 2 Drawing Sheets

METHOD FOR FORMING INTERCONNECT FOR INTEGRATED CIRCUITS

BACKGROUND OF THE INVENTION

1. Field of the Invention

The present invention relates generally to integrated circuits, and more specifically to a method for forming interconnect lines in integrated circuits.

2. Description of the Prior Art

As integrated circuit devices become more complex, greater numbers of interconnect levels are required to connect the various sections of the device. Complex devices are being designed which have two or more levels of interconnect. These levels of interconnect are typically made of polycrystalline silicon or metal. When multiple layers of interconnect are used in this manner, difficulties are encountered in forming upper interconnect levels because of uneven topographical features caused by lower interconnect levels. Thus, topography of interconnect layers affects the ease of manufacturing of the integrated circuit device.

The uneven topographical features of multiple interconnect levels are caused by forming the various interconnect layers above each other, resulting in the creation of hills and valleys on the surface of the device. Those skilled in the art will recognize it is difficult to get upper interconnect layers to cross over the hills and fill in the valleys created by the underlying interconnect layers. These step coverage problems can result in voids and other defects in the interconnect signal lines themselves, and in the contact vias formed between interconnect signal lines.

In order to make forming upper interconnect levels easier, planarization of lower interconnect levels is routinely performed. Typically, a layer of material such as a reflow glass or spin on glass can be used as part of an interlevel dielectric layer. These materials, when applied properly, have an upper surface which is smoother and more nearly planar than the topography of the underlying surface. This allows the roughness caused by underlying interconnect layers to be smoothed out somewhat prior to the formation of the next layer of interconnect. This next layer of interconnect is then formed on top of the planarized interlevel dielectric layer. Even with this technique, step coverage problems exist since formation of the interconnect layer on the planarized dielectric layer generates uneven topographical features for the next dielectric layer, requiring further planarization. In addition, the planarization improves the flatness of the surface, but does not completely eliminate hills and valleys caused by underlying topographical features.

Therefore, it would be desirable to provide a method for forming interconnect lines which are free of voids and other defects, and which result in a more planar topography. It is also desirable that such a method does not significantly increase the complexity of the manufacturing process.

SUMMARY OF THE INVENTION

It is therefore an object of the present invention to provide a method for forming metal interconnect signal lines which result in a more planar topography.

It is another object of the present invention to provide such a method and structure which is compatible with standard process flows, and which add minimal additional complexity to the fabrication of a typical integrated circuit.

Therefore, according to the present invention, a thin conductive layer is formed over an underlying structure in an integrated circuit. The underlying structure can be either a semiconductor substrate or an interlevel interconnect signal line. An insulating layer is deposited over the device. The insulating layer is patterned and etched in order to expose a portion of the underlying conductive layer and to define an interconnect signal line. When the signal line locations are etched away, the thin conductive layer acts as an etch stop and protects the underlying structure. A metal refill process can be used to then form interconnects and contacts within the etched interconnect lines. This results in interconnect and contacts having upper surfaces which are substantially coplanar with the upper surface of the insulating layer in which they are formed.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
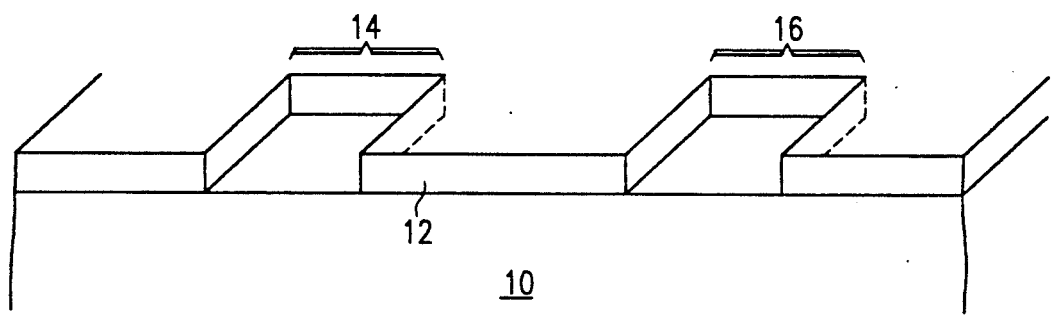
FIGS. 1-5 are sectional views illustrating a preferred method for forming interconnect in integrated circuits according to the present invention.

Referring to FIG. 1, a contact and interconnect is to be formed over an underlying region 10 of an integrated circuit. The underlying region 10 is either a semiconductor substrate or an underlying interconnect signal line. An insulating layer 12, typically made of oxide, is deposited or grown over the device. Contact openings 14, 16 are created in the insulating layer 12 using methods known in the art.

Figure 2:
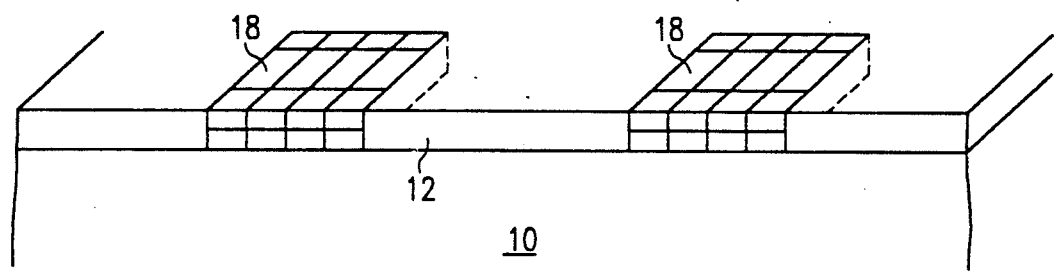

FIG. 2 illustrates the device after the contact openings 14, 16 are filled with conductive material 18. Conductive material 18, may for example, be made of tungsten or aluminum. The conductive material 18 can be selectively deposited into the contact openings 14, 16 using selective deposition techniques known in the art, or the layer of conductive material 18 can be deposited over the device and then etched back such that the upper surface of the conductive material 18 lies planar with the upper surface of the insulating layer 12.

Figure 3:
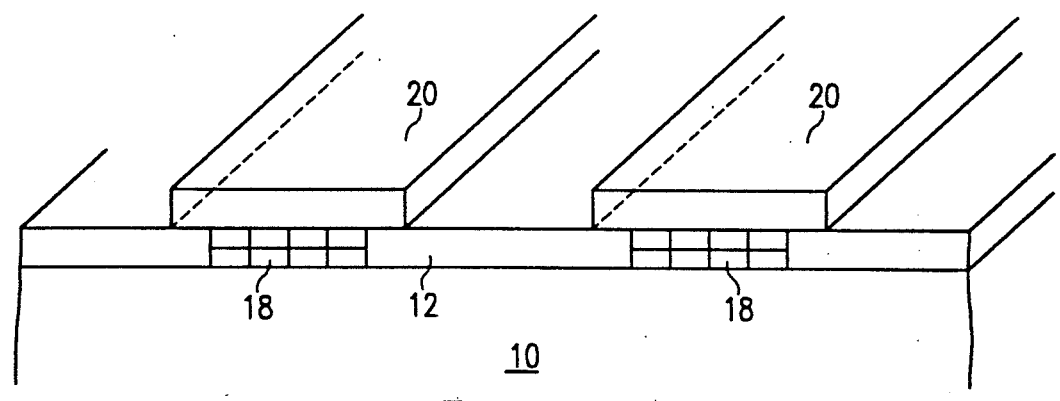

Referring to FIG. 3, a thin layer of metal 20 is deposited and patterned over the conductive material 18. The thin layer of metal 20 defines a pattern for interconnect which will be formed on the device. The width of the thin layer of metal 20 should be wider than the width of the prospective interconnect line. The larger width allows for some errors in mask registration. Metal layer 20 will typically have a thickness of between 300 and 1500 angstroms.

Figure 4:
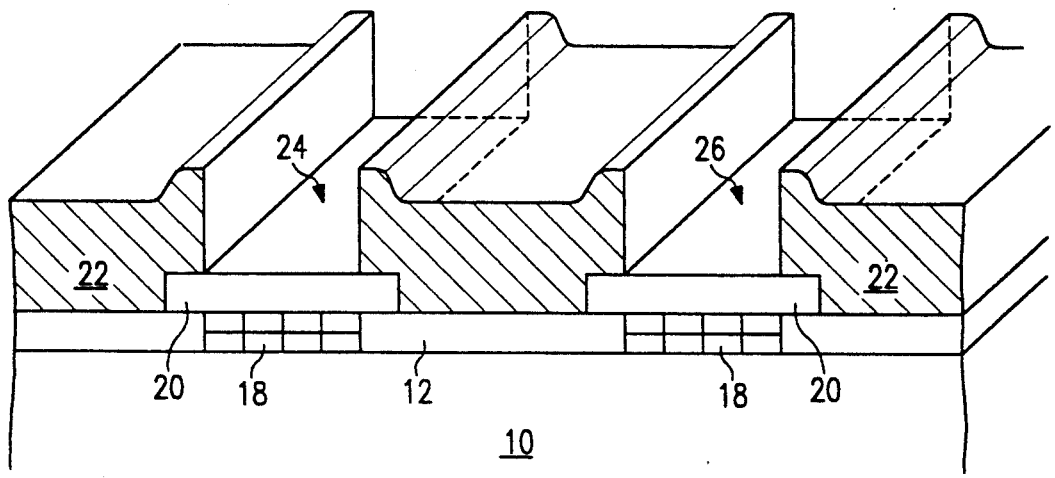

As shown in FIG. 4, a second layer of insulating material 22, typically made of oxide, is deposited over the device. The second insulating layer 22 is then patterned and etched to expose a portion of the thin layer of metal 20 and form interconnect molds 24, 26. One advantage of using the thin layer of metal 20, is that it acts as an etch stop and protects the underlying material 18 during formation of the interconnect molds 24, 26.

Figure 5:
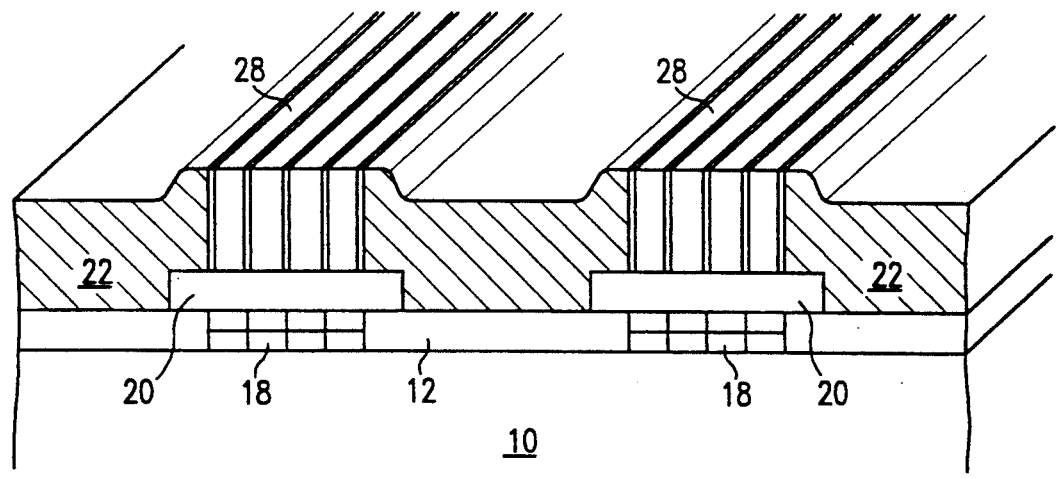

Referring to FIG. 5, interconnect molds 24, 26 are filled with a second conductive layer 28. The conductive layer 28 can be made of, for example, tungsten, aluminum, or copper. The conductive layer 28 can be formed by depositing a layer of conductive material over the device and etching portions of it away. Alternatively, selective deposition can be used to form conductive layer 28. Another advantage of using the thin layer of metal 20 is that it will act as a catalytic seed for selective deposition. Additionally, the thin layer of metal 20 will act as an adhesive layer for the conductive layer 28.

Although the present invention has been described with reference to forming one layer of interconnect, it is possible to use this process for multi-level metalization. For example, following the method described in reference to FIG. 5, another insulating layer can be deposited and patterned to create contact vias to the conductive layer 28. The vias can then be filled either by selective deposition or blanket deposition and etchback with a conductive material, as shown in FIG. 2. The process continues as described in reference to FIGS. 3-5. Thus, the presently described invention can be utilized in forming each layer of interconnect in an integrated circuit.

Those skilled in the art will recognize that the thin layer of metal 20 used in the presently claimed invention serves a variety of functions. First, it protects the underlying structure by acting as an etch stop during formation of the interconnect molds 24, 26. Second, the thin layer of metal 20 can act as a catalytic seed for the second conductive layer 28 if selective deposition is used to form the layer. Additionally, the thin layer of metal 20 acts as an adhesive layer during formation of the second conductive layer 28. Finally, the thin layer of metal 20 does not significantly impact manufacturing of the integrated circuit. It is easy to pattern and etch, and because it is thin, it does not significantly affect the planarity of the device.

In summary, the invention described above provides a method for planarizing interconnect signal lines. Furthermore, the method is compatible with standard processing techniques, and does not significantly increase the complexity in fabricating a typical integrated circuit.

While the invention has been particularly shown and described with reference to a preferred embodiment, it will be understood by those skilled in the art that various changes in form and detail may be made therein without departing from the spirit and scope of the invention.

What is claimed is:

1. A method for forming interconnect in an integrated circuit, comprising the steps of:
   forming a first conductive layer over an underlying first insulating layer, wherein the first conductive layer defines a pattern for interconnect;
   depositing a second insulating layer over the integrated circuit;
   etching a portion of the second insulating layer according to the pattern for interconnect to define an interconnect mold, wherein the interconnect mold is coincident with the first conductive layer and exposes a portion of the underlying first conductive layer; and
   forming a second conductive layer over the exposed first conductive layer, wherein the second conductive layer fills in the interconnect mold such that the second conductive layer is aligned with and lies on top of the first conductive layer, and wherein the first and second conductive layers form a single interconnect layer.

2. The method of claim 1, wherein said first conductive layer comprises metal.

3. The method of claim 2, wherein first conductive layer comprises tungsten.

4. The method of claim wherein said step of forming a first conductive layer comprises the steps of:
   depositing the conductive layer over the device; and anisotropically etching said first conductive layer, wherein the pattern for interconnect is defined.

5. The method of claim wherein said first conductive layer has a width which is wider than said second conductive layer.

6. The method of claim 1, wherein said second insulating layer comprises oxide.

7. The method of claim 1, wherein said second conductive layer comprises metal.

8. The method of claim 7, wherein said metal comprises tungsten.

9. The method of claim 7, wherein said metal comprises aluminum.

10. The method of claim 7, wherein said metal comprises copper.

11. The method of claim 1, wherein said step of forming a second conductive layer comprises selectively depositing said second conductive layer.

12. A method for forming interconnect in an integrated circuit, comprising the steps of:
    forming an opening through a first insulating layer to expose a portion of a conductive element;
    forming a first conductive layer in said opening, wherein the first conductive layer is in contact with said conductive element;
    forming a second conductive layer over said first conductive layer and portions of said first insulating layer;
    depositing a second insulating layer over the integrated circuit;
    defining an interconnect pattern in said second insulating layer and removing portions of said second insulating layer to expose a portion of the underlying second conductive layer; and
    forming a third conductive layer in the interconnect pattern, wherein a conductive contact is formed between the conductive element and the third conductive layer.

13. The method of claim 12, wherein said first insulating layer comprises oxide.

14. The method of claim 12, wherein said conductive element comprises a semiconductor substrate.

15. The method of claim 12, wherein said conductive element comprises an interlevel interconnect layer.

16. The method of claim 12, wherein said first conductive layer comprises metal.

17. The method of claim 16, wherein said metal comprises aluminum.

18. The method of claim 16, wherein said metal comprises tungsten.

19. The method of claim 12, wherein said step of forming the first conductive layer comprises selectively depositing the layer onto the integrated circuit.

20. The method of claim 12, wherein said step of forming the first conductive layer comprises the steps of:
   depositing the first conductive layer over the integrated circuit; and
   anisotropically etching said first conductive layer, wherein the upper surface of the first conductive layer is planar with the upper surface of the first insulating layer.

21. The method of claim 12, wherein the second conductive layer comprises metal.

22. The method of claim 21, wherein said metal comprises tungsten.

23. The method of claim 12, wherein said second conductive layer has a width which is wider than the third conductive layer.

24. The method of claim 12, wherein said second insulating layer comprises oxide.

25. The method of claim 12, wherein said third conductive layer comprises metal.

26. The method of claim 25, wherein said metal comprises tungsten.

27. The method of claim 25, wherein said metal comprises aluminum.

28. The method of claim 12, wherein said step of forming the third conductive layer comprises selectively depositing said third conductive layer onto the integrated circuit.

29. The method of claim 12, wherein said step of forming the third conductive layer comprises the steps of:
   depositing the third conductive layer over the integrated circuit; and
   anisotropically etching said third conductive layer, wherein the upper surface of the third conductive layer is nearly planar with the upper surface of the second insulating layer.

30. An interconnect structure in an integrated circuit, comprising:
   a first conductive layer overlying a first insulating layer, wherein said first conductive layer defines a pattern for interconnect;
   a second insulating layer overlying the integrated circuit;
   an interconnect mold in the second insulating layer according to the pattern for interconnect, wherein said interconnect mold is coincident with the first conductive layer and exposes a portion of the first conductive layer; and
   a second conductive layer filling in said interconnect mold such that the second conductive layer is aligned with and lies on top of the first conductive layer, wherein the first and second conductive layers form a single interconnect layer.

31. The structure of claim 30, wherein said first conductive layer comprises metal.

32. The structure of claim 31, wherein said metal comprises tungsten.

33. The structure of claim 30, wherein said first conductive layer has a width which is wider than said second conductive layer.

34. The structure of claim 30, wherein said first and second insulating layers comprise oxide.

35. The structure of claim 30, wherein said second conductive layer comprises metal.

36. The structure of claim 35, wherein said metal comprises tungsten.

37. The structure of claim 35, wherein said metal comprises aluminum.

38. The structure of claim 30, wherein the upper surface of said second conductive layer is nearly planar with the upper surface of said second insulating layer.

39. The structure of claim 30, wherein said first conductive layer is made of a material which acts as an etch stop to protect underlying layers from damage during formation of the interconnect mold.

* * * * *